United States Patent
Shimizu et al.

(10) Patent No.: US 7,179,752 B2
(45) Date of Patent: Feb. 20, 2007

(54) DRY ETCHING METHOD

(75) Inventors: Akitaka Shimizu, Nirasaki (JP);
Takashi Tsuruta, Nirasaki (JP);
Takashi Enomoto, Nirasaki (JP);
Hiromi Oka, Nirasaki (JP); Akiteru Koh, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 347 days.

(21) Appl. No.: 10/482,405

(22) PCT Filed: Jul. 5, 2002

(86) PCT No.: PCT/JP02/06830

§ 371 (c)(1),
(2), (4) Date: May 18, 2004

(87) PCT Pub. No.: WO03/007357

PCT Pub. Date: Jan. 23, 2003

(65) Prior Publication Data

US 2004/0214445 A1    Oct. 28, 2004

(30) Foreign Application Priority Data

Jul. 10, 2001  (JP)  ............................. 2001-210034

(51) Int. Cl.
*H01L 21/302* (2006.01)

(52) U.S. Cl. ................................. 438/733; 257/E21.256

(58) Field of Classification Search ................. 438/714, 438/733, 706–711, 725–727, 729, 730; 216/67; 257/E21.218, E21.222, E21.245, E21.246, 257/E21.254, E21.256, E21.31, E21.311
See application file for complete search history.

(56) References Cited

U.S. PATENT DOCUMENTS

| | | | |
|---|---|---|---|
| 3,997,367 A | 12/1976 | Yau | |
| 6,136,723 A | 10/2000 | Nagase | |
| 6,143,476 A * | 11/2000 | Ye et al. | ..... 430/318 |
| 6,399,286 B1 * | 6/2002 | Liu et al. | ..... 430/316 |
| 2001/0004066 A1 | 6/2001 | Toshima et al. | |

FOREIGN PATENT DOCUMENTS

| | | |
|---|---|---|
| JP | 2000-150486 | 5/2000 |
| JP | 2001-15581 | 1/2001 |

OTHER PUBLICATIONS

Takuo Sugano, "Handotai Plasma Process Gijutsu", SangyoTosho Kabushiki Kaisha, pp. 41-43 Jul. 10, 1980.
M. Nagase et al., "Study of sub-30nm gate Etching Technology", Proceedings of International Symposium on Dry Process. pp. 17-22 Oct. 20, 2001.

* cited by examiner

*Primary Examiner*—David Vu
(74) *Attorney, Agent, or Firm*—Oblon, Spivak, McClelland, Maier & Neustadt, P.C.

(57) ABSTRACT

A dry etching method involves plasma etching an organic anti-reflecting coating film through a mask layer made of photoresist and having a predetermined pattern by using an etching gas of $CF_4$ and $O_2$. The method allows an organic anti-reflecting coating film to be etched such that the etched film exhibits a side wall portion having a better shape as compared with that formed by a conventional technique.

10 Claims, 9 Drawing Sheets

EXPOSURE・DEVELOPMENT

CF$_4$ + O$_2$ (PLASMA ETCHING)

CF$_4$ + O$_2$ (PLASMA ETCHING)

CF$_4$ + CHF$_3$ (PLASMA ETCHING)

DRY ETCHING METHOD

FIELD OF THE INVENTION

The present invention relates to a dry etching method for use in manufacturing a semiconductor device; and, more particularly, to a dry etching method for etching an organic anti-reflecting coating (ARC) film through a mask layer made of, e.g., a photoresist.

BACKGROUND OF THE INVENTION

Recently, an anti-reflecting coating (ARC) film is widely employed in a field of manufacturing semiconductor devices in order to prevent, e.g., a generation of standing waves due to multiple interferences within a resist film during an exposure process using, e.g., a stepper. Conventionally employed as such an ARC film is an organic ARC film using an organic polymer.

FIGS. 8A to 8C describe an exemplary manufacturing process of a semiconductor device employing the organic ARC film.

As shown in FIG. 8A, formed on a semiconductor wafer (a silicon substrate) 201 are an insulating layer 202 made of, e.g., a silicon oxide film and a conductor layer 203 formed of, e.g., polysilicon and, further, formed on the conductor layer 203 by, e.g., a spin coating method are an organic ARC film 204 and a mask layer 205 made of a photoresist.

The mask layer 205 made of the photoresist is shaped into a predetermined pattern, as shown in FIG. 8B, by being exposed to light and being subsequently developed while undergoing an exposure process by, e.g., a stepper and a developing process by a developer system, respectively. Thereafter, the organic ARC film 204 is patterned to have a preset pattern, as shown in FIG. 8C, by being etched through the mask layer 205 by plasma etching employing an etching gas containing $Cl_2$ and $O_2$ gases.

Subsequently, the conductor layer 203 is etched through the mask layer 205 and the organic ARC film 204 into a predetermined pattern (not shown) and then the mask layer 205 and the organic ARC film 204 are removed by ashing.

As described above, the plasma etching employing the etching gas containing $Cl_2$ and $O_2$ gases has been conventionally employed to etch the organic ARC film.

In such a conventional method, however, it is difficult to form the organic ARC film 204 to have a vertical sidewall since a sidewall 204a of the organic ARC film 204 is of a tapered profile as shown in FIG. 8C.

Further, as illustrated in FIG. 9, if a shape of the pattern has a dense pattern region (a left part of the drawing) in which neighboring patterns are close to each other and a sparse pattern region (a right part of the drawing) in which neighboring patterns are spaced apart from each other, the sidewall profile tends to vary between the dense pattern region and the sparse pattern region.

That is, in the example provided in FIG. 9, a profile of the sidewall is found to be tapered more in the sparse pattern region than in the dense pattern region.

Further, such tapered profile of the sidewall tends to vary at a central portion and a peripheral portion even on a single wafer.

For this reason, it has been difficult to perform an etching such that sidewall profiles are formed to be consistently of a high quality throughout the central portion, the peripheral portion, the dense pattern region and the sparse pattern region of the semiconductor wafer, even in case of controlling the sidewall profiles by adjusting etching conditions such as a flow rate and a pressure of the etching gas, a temperature of the semiconductor wafer during the etching, a high frequency power supplied to an electrode of a parallel plate type plasma etching apparatus, and so on.

SUMMARY OF THE INVENTION

It is, therefore, an object of the present invention to provide a dry etching method capable of etching an organic ARC film to have a high-quality sidewall profile.

In accordance with the present invention, there is provided a dry etching method for etching an organic anti-reflecting coating film through a mask layer formed to have a pattern, wherein the organic anti-reflecting coating film is etched by plasma etching employing an etching gas containing a $CF_4$ gas and an $O_2$ gas, and a trimming of a line width is carried out by etching the mask layer and the anti-reflecting coating film in a transversal direction.

Further, in the above-described dry etching method, the pattern may have a dense pattern region in which neighboring patterns are close to each other and a sparse pattern region in which neighboring patterns are spaced apart from each other, and the trimming may be substantially uniformly carried out at the dense pattern region and the sparse pattern region.

Furthermore, in the above-described dry etching method, an amount of the trimming may be controlled by varying a flow rate of $O_2$/(a flow rate of $CF_4$ +a flow rate of $O_2$) of the etching gas.

Still further, in the above-described dry etching method, an amount of the trimming may be controlled by varying a power density of a high frequency power applied to a lower electrode.

Moreover, in the above-described dry etching method, the mask layer may be a resist film, and a silicon oxide film is formed under the organic anti-reflecting coating film.

The resist film may be an ArF resist film.

Further, the silicon oxide film may be etched by using a gaseous mixture containing a $CF_4$ gas and a $CHF_3$ after etching the organic anti-reflecting coating film.

In accordance with the present invention, there is provided a dry etching method for etching an organic anti-reflecting coating film through a mask layer formed to have a pattern, wherein the organic anti-reflecting coating film is etched by plasma etching employing an etching gas containing an $N_2$ gas and an $O_2$ gas, and a trimming of a line width is carried out by etching the mask layer and the anti-reflecting coating film in a transversal direction.

The pattern may be a dense pattern region in which neighboring patterns are close to each other and a sparse pattern region in which neighboring patterns are spaced apart from each other, and the trimming is substantially uniformly carried out at the dense pattern region and the sparse pattern region.

Preferably, a flow rate of the $N_2$ gas is substantially identical to that of the $O_2$ gas.

DETAILED DESCRIPTION OF THE PREFERRED EMBODIMENT

Figure 1A:
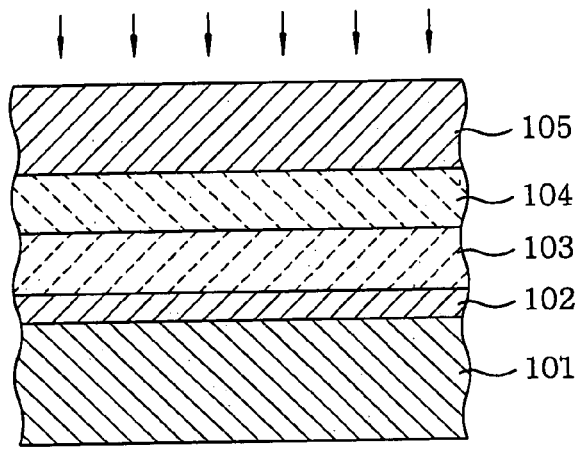
FIGS. 1A to 1C provide schematic cross sectional views of a wafer explaining a preferred embodiment of the present invention.
Figure 1B:
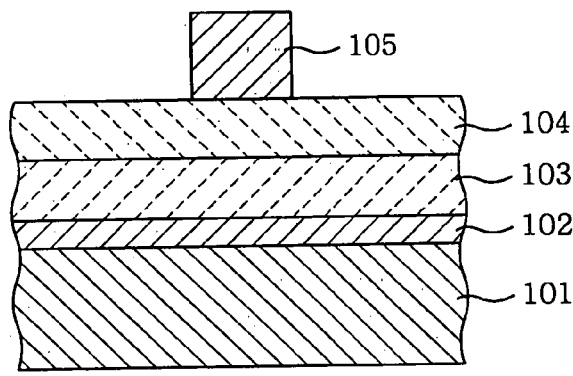
Figure 1C:
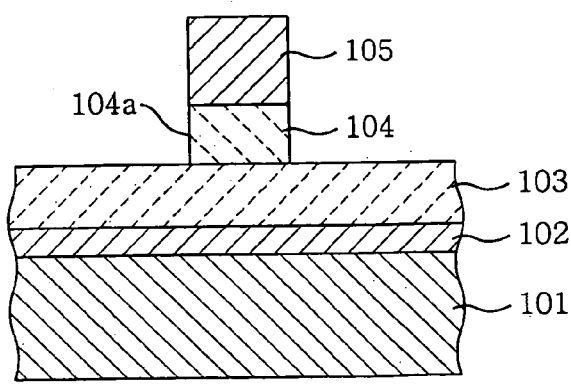

Preferred embodiments of the present invention will now be described in detail with reference to the accompanying drawings. Referring to FIGS. 1A to 1C, there are illustrated partially enlarged schematic longitudinal cross sectional views of a semiconductor wafer (silicon substrate) for explaining a preferred embodiment of the present invention.

As shown in FIG. 1A, formed on a semiconductor wafer (silicon substrate) 101 are an insulating layer 102 made of, e.g., a silicon oxide film and a conductor layer 103 formed of, e.g., polysilicon and, further, formed on the conductor layer 103 by, for example, a spin coating method are an organic ARC film 104 and a mask layer 105 made of a (?:"a" inserted) photoresist.

The mask layer 105 is first exposed to light and developed while undergoing an exposure process by a stepper and a developing process by a developer, respectively, to be formed into a predetermined pattern as shown in FIG. 1B. Thereafter, the organic ARC film 104 is etched through the mask layer 105 by plasma etching employing an etching gas including $CF_4$ and $O_2$ gases from a state shown in FIG. 1B, so that the organic ARC film 104 is patterned to have a preset pattern as illustrated in FIG. 1C. Further, after completing the etching of the organic ARC film 104, the conductor layer 103 is etched through the mask layer 105 and the organic ARC film 104 into a predetermined pattern. Then, the mask layer 105 and the organic ARC film 104 are removed by ashing.

Figure 2:
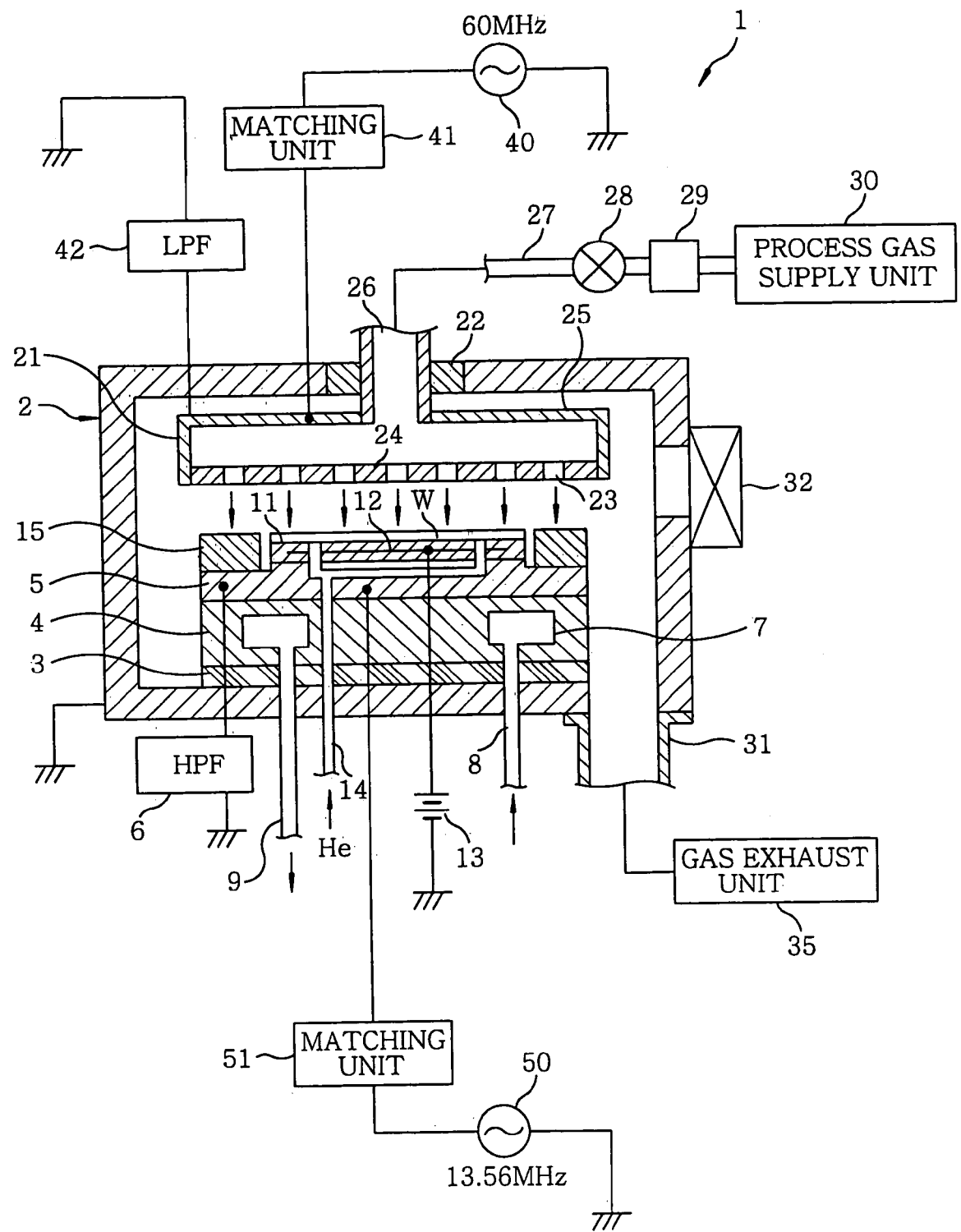
FIG. 2 exemplifies a configuration of an apparatus for use in the embodiment of the present invention.

FIG. 2 schematically illustrates an exemplary configuration of a plasma processing apparatus (etching apparatus) 1 for use in the preferred embodiment of the present invention. As shown therein, the etching apparatus 1 is a capacitively coupled parallel plate type etching apparatus having an upper and a lower electrode plate placed to face each other in parallel, one side of each plate being connected to a power supply for plasma generation.

The etching apparatus 1 includes, for example, a cylindrical chamber 2 which is grounded and made of aluminum whose surface is treated by anodic oxidation (alumite-treated). Installed on a bottom portion of the chamber 2 via an insulating plate 3 such as ceramic is a substantially columnar susceptor support 4 for mounting thereon a wafer W. Disposed on the susceptor support 4 is a susceptor 5 serving as a lower electrode. Connected to the susceptor 5 is a high pass filter (HPF) 6.

Formed within the susceptor support 4 is a temperature control medium path 7. A temperature control medium is introduced into the temperature control medium path 7 via an inlet line 8 to circulate therethrough and is exhausted via an outlet line 9. By the circulation of the temperature control medium, the temperature of the susceptor 5 is maintained at a desired level.

The susceptor 5 is of a disk shape with a central topmost portion being protruded. Mounted on the central topmost portion of the susceptor 5 is an electrostatic chuck 11 shaped similar to the wafer W. The electrostatic chuck 11 includes an electrode 12 embedded in an insulating material. The electrostatic chuck 11 electrostatically adsorbs the wafer W by a Coulombic force generated by, e.g., a DC voltage of 1.5 kV supplied from a DC power supply 13 coupled to the electrode 12.

Further, formed through the insulating plate 3, the susceptor support 4, the susceptor 5 and the electrostatic chuck 11 is a gas channel 14 for supplying a heat transfer medium (for example, a He gas) to a backside of the wafer W to be processed. Heat is transferred between the susceptor 5 and the wafer W through the heat transfer medium, so that the wafer W is maintained at a predetermined temperature.

An annular focus ring 15 is disposed on an upper peripheral portion of the susceptor 5 to surround the wafer W mounted on the electrostatic chuck 11. The focus ring 15 is made of an insulating material, e.g., ceramic or quartz, or a conductive material, and serves to improve an etching uniformity.

Further, installed above the susceptor 5 to face thereto in parallel is an upper electrode 21. The upper electrode 21 is supported within the chamber 2 via an insulating member 22. The upper electrode 21 includes an electrode plate 24 (made of, e.g., quartz) facing toward the susceptor 5 and provided with a plurality of injection openings 23 and an electrode support 25 (made of a conductive material, e.g., aluminum whose surface is alumite treated) that serves to support the electrode plate 24. Further, the distance between the susceptor 5 and the upper electrode 21 is adjustable.

Formed at a center of the electrode support 25 of the upper electrode 21 is a gas inlet opening 26 communicating with a gas supply line 27, which in turn is connected to a process gas supply unit 30 via a valve 28 and a mass flow controller 29. An etching gas for plasma etching is supplied from the process gas supply unit 30. Though there is illustrated in FIG. 2 only one process gas supplying system including the process gas supply unit 30 and the like, the plasma processing apparatus is provided with a plurality of process gas supplying systems capable of supplying gases for example, $CF_4$, $O_2$, $N_2$, $CHF_3$, and the like, into the chamber 2 by independently controlling flow rates thereof.

Connected to a bottom portion of the chamber 2 is a gas exhaust line 31, which in turn is coupled to a gas exhaust unit 35. The gas exhaust unit 35 includes a vacuum pump such as a turbo molecular pump or the like, and serves to reduce an inner pressure of the chamber 2 down to a predetermined vacuum level (e.g., 0.67 Pa or less). Further, installed on a sidewall of the chamber 2 is a gate valve 32. The wafer W is transferred between the chamber 2 and an adjacent load lock chamber (not shown) while the gate valve 32 is opened.

Connected to the upper electrode 21 via a matching unit 41 is a first high frequency power supply 40. Further connected to the upper electrode 21 is a low pass filter (LPF) 42. The first high frequency power supply 40 has a frequency ranging from 50 to 150 MHz. By applying a high frequency power in such a range, a plasma of high density in a desired dissociation state can be generated within the chamber 2, which makes it possible to execute a plasma etching under a pressure lower than that in conventional cases. The frequency of the first high frequency power supply 40 preferably ranges from 50 to 80 MHz. Typically, its frequency is 60 MHz as illustrated in FIG. 2 or thereabouts.

Connected to the susceptor 5 serving as the lower electrode via a matching unit 51 is a second high frequency power supply 50 whose frequency ranges from several hundred KHz to less than twenty MHz. By applying a power of a frequency in such a range, a proper ionic action can be facilitated without causing any damage on the wafer W to be processed. Typically, the frequency of the second frequency power supply 50 is, e.g., 13.56 MHz as shown in FIG. 2 or 800 KHz.

In the following, there will be explained a process for etching the organic ARC film 104 formed on the wafer W into a predetermined pattern through the mask layer 105 made of the photoresist by employing the etching apparatus 1 configured as described above.

As described above, the gate valve 32 is opened first, and then the wafer W, on which the organic ARC film 104 and the mask layer 105 patterned into the predetermined pattern are formed, is carried into the chamber 2 from the load lock chamber (not shown) to be mounted on the electrostatic chuck 11. A DC voltage is then supplied from the DC power supply 13 to the electrostatic chuck 11, so that the wafer W is adsorbed thereto electrostatically Then, the gate valve 32 is closed and the chamber 2 is evacuated to a predetermined vacuum level by the gas exhaust unit 35. Then, the valve 28 is opened, and an etching gas containing $Cl_4+O_2$ is supplied from the process gas supply unit 30 onto the wafer W. The etching gas, a flow rate of which is controlled by the mass flow controller 29, is discharged uniformly towards the wafer W as indicated by arrows in FIG. 2 via the process gas supply line 27, the gas inlet opening 26, a hollow central space of the upper electrode 21 and the injection openings 23 of the electrode plate 24. At the same time, the inner pressure of the chamber 2 is maintained at a predetermined pressure level. Thereafter, by applying high frequency powers to the upper electrode 21 and the susceptor 5 serving as the lower electrode from the first and the second high frequency power supply 40 and 50, respectively, the etching gas is converted into a plasma to thereby perform the etching on the organic ARC film 104 on the wafer W. Such an etching process is terminated at the moment the state shown in FIG. 1C is obtained.

Figure 3:
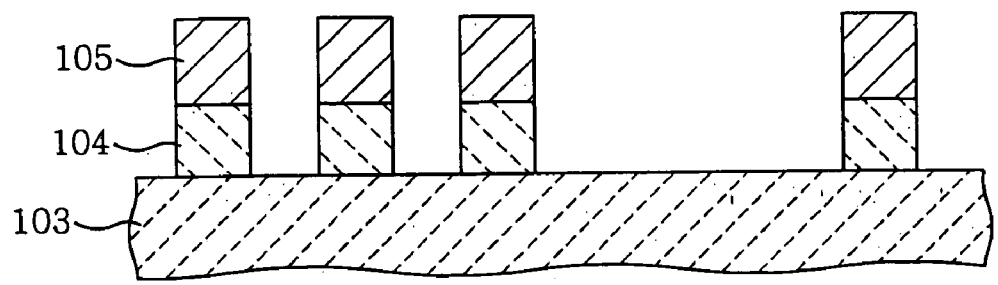
FIG. 3 describes a pattern structure in the embodiment of the present invention.

As illustrated in FIG. 3, a wafer of 200 mm, which is provided with a pattern shaped to have a dense pattern region (a left part of FIG. 3, line:space=1:1) in which neighboring patterns are placed close to each other and a sparse pattern region (a right part of FIG. 3, line:space=1:10 or greater) in which neighboring patterns are spaced apart from each other, was etched as a first example through the processes described above under the following condition:

| an etching gas: | $CF_4$ (a flow rate of 35 sccm) + $O_2$ (a flow rate of 5 sccm) |
|---|---|
| a flow rate of $CF_4$: | a flow rate of $O_2$ = 7:1 |
| a pressure: | 0.67 Pa (5 mTorr) |
| a high frequency power applied to the upper electrode: | 325 W |
| a high frequency power applied to the lower electrode: | 30 W |
| a distance between the electrodes: | 80 mm |
| a susceptor temperature: | 80° C. |

The pattern of the organic ARC film obtained by the above etching process in accordance with the first embodiment was investigated by a scanning electron microscope (SEM) to find that a sidewall profile of the organic ARC film 104 was substantially vertical as shown in FIG. 3. Moreover, such a high quality sidewall profile was found throughout the dense pattern region and the sparse pattern region and, further, the central portion and the peripheral portion of the wafer. Further, for the pattern of the organic ARC film thus obtained, a deviation of a line with of the pattern actually formed by etching from a designed line width (i.e., CD (critical dimension) shift) was measured in both of the dense pattern region and the sparse pattern region of respective parts on the surface of the wafer (the central portion and the peripheral portion thereof).

Figure 4:
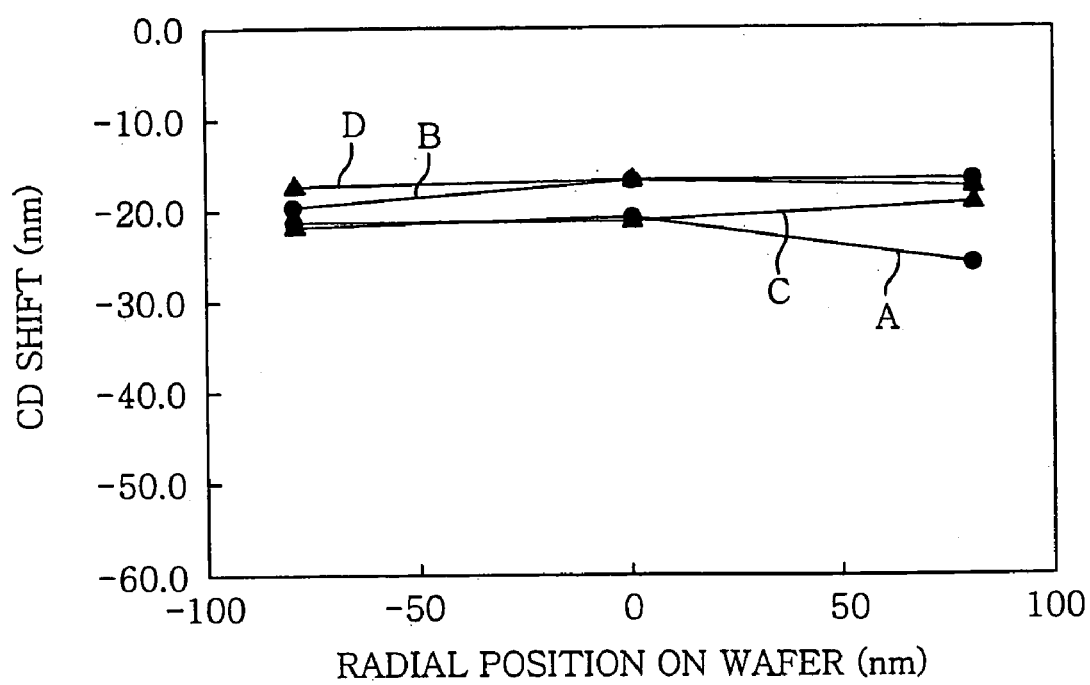
FIG. 4 shows a measurement result of a CD shift in a first example.

FIG. 4 provides a graph showing a measurement result of the CD shift, wherein a vertical axis represents a CD shift while a horizontal axis stands for a radial position on the surface of the wafer (a distance from a center of the wafer) (mm).

Further, in FIG. 4, a solid line A indicates a measurement result of an X-directional line width in the dense pattern region; a solid line B represents a measurement result of an X-directional line width in the sparse pattern region; a solid line C shows a measurement result of a Y-directional line width in the dense pattern region; and a solid line D describes a measurement result of a Y-directional line width in the sparse pattern region.

As shown in FIG. 4, in the first embodiment, a difference between a line width in the dense pattern region and that in the sparse pattern region and a difference between line widths within the surface of the wafer were both small. An average of the CD shifts was −19.8 nm and the difference between a line width in the dense pattern region and that in the sparse pattern region was 4.4 nm.

For comparison, an etching of an organic ARC film having the same pattern as illustrated above was carried out by employing a conventional etching gas containing $Cl_2+O_2$ under the following condition:

| an etching gas: | $Cl_2$ (a flow rate of 10 sccm) + $O_2$ (a flow rate of 30 sccm) |
|---|---|
| a pressure: | 0.67 Pa (5 mTorr) |
| a high frequency power applied to the upper electrode: | 325 W |
| a high frequency power applied to the lower electrode: | 30 W |
| a distance between the electrodes: | 80 mm |
| a susceptor temperature: | 80° C. |

Figure 9:
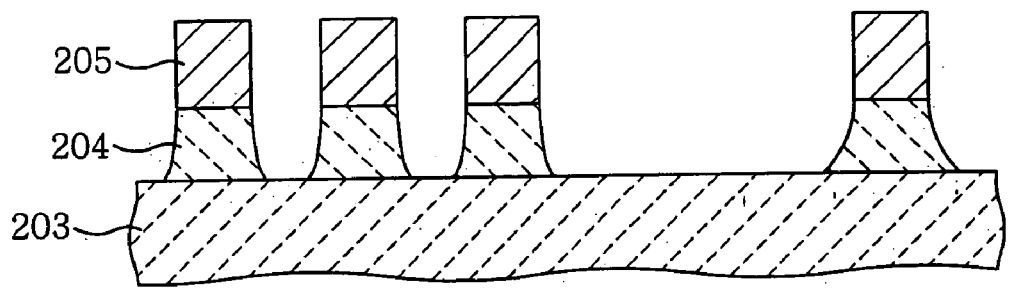
FIG. 9 explains the prior art pattern structure.

The pattern of the organic ARC film obtained by the above etching process was investigated by the SEM to find that a sidewall of the organic ARC film 204 had a tapered profile as shown in FIG. 9.

Figure 10:
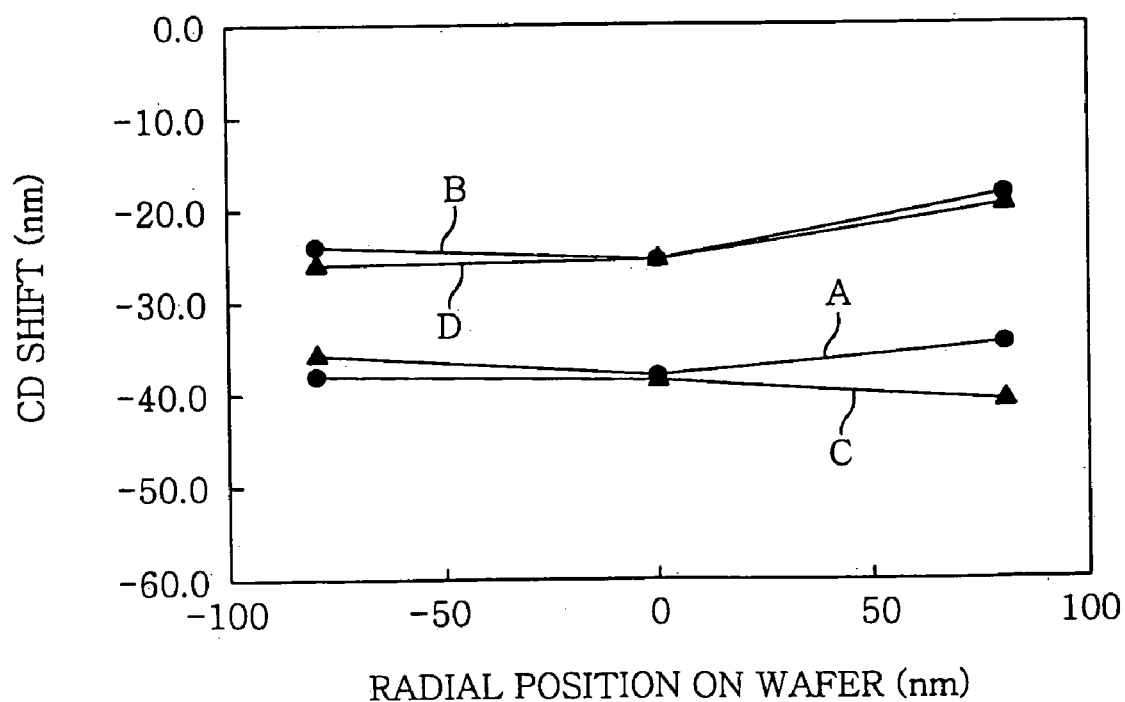
FIG. 10 charts a measurement result of a CD shift in a comparative example.

Further, for the pattern of the organic ARC film thus formed, a deviation of a line width of the pattern actually formed by etching (CD shift) from a designed line width was measured, and the result is provided in a graph of FIG. 10 charted in a similar manner as in the graph of FIG. 4.

As shown in FIG. 10, in the comparative example, a difference between a line width in a dense pattern region and that in a sparse pattern region and a difference between line widths within the surface of a wafer were found to be greater than those in the case of the example described in FIG. 4. An average of CD shifts was −29.9 nm and the difference between the line width from the dense pattern region and that from the sparse pattern region was 14.6 nm.

Next, as a second example, the etching gas including $CF_4+O_2$ mentioned above was replaced with a gas of $N_2+O_2$, and a wafer with a predetermined pattern having a dense pattern region (a left part in FIG. 3) and a sparse pattern region (a right part in FIG. 3), as illustrated in FIG. 3, was etched under the following condition:

| | |
|---|---|
| an etching gas: | $N_2$ (a flow rate of 20 sccm) + $O_2$ (a flow rate of 20 sccm) |
| a high frequency power applied to the upper electrode: | 325 W |
| a high frequency power applied to the lower electrode: | 30 W |
| a distance between the electrodes: | 80 mm |
| a susceptor temperature: | 80° C. |

The pattern of the organic ARC film obtained by the etching in accordance with the second example was investigated by the SEM to find that a high quality sidewall profile of the organic ARC film could be made to be virtually vertical in both of the dense pattern region and the sparse pattern region, as in the first example.

Figure 5:
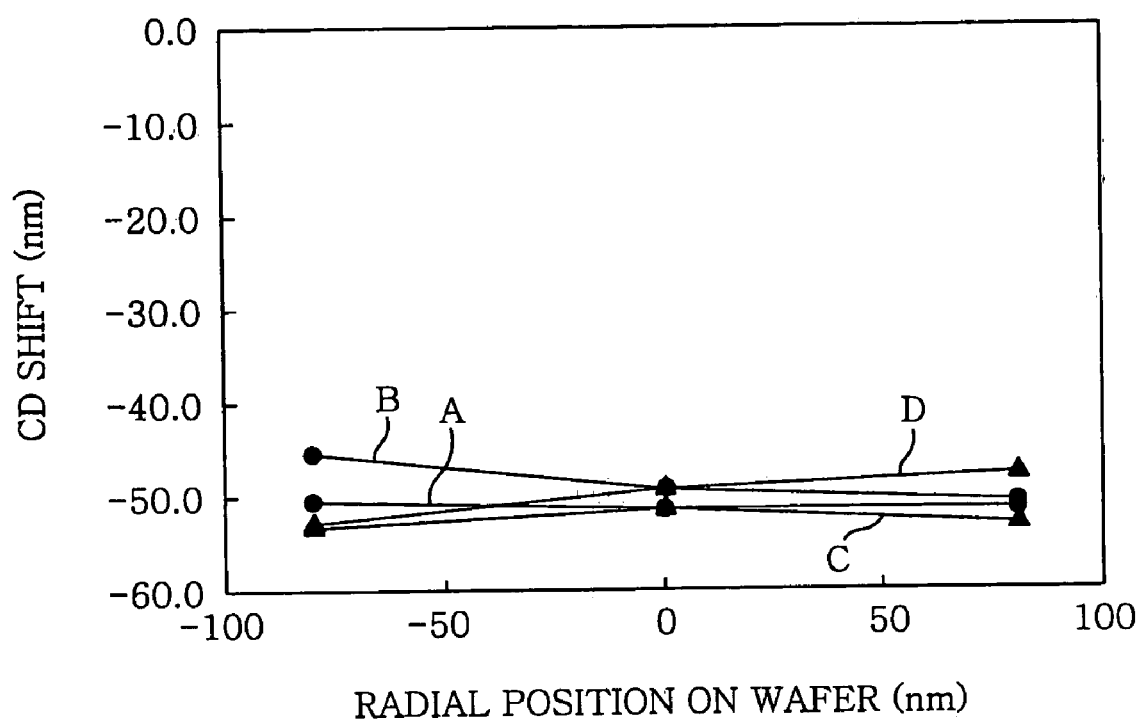
FIG. 5 provides a measurement result of a CD shift in a second example.

Further, a deviation of a line width of the pattern actually fabricated by etching (CD shift) from a designed line width was measured, and the result is provided in a graph of FIG. 5 presented similarly to the graph in FIG. 4.

As shown in FIG. 5, in the second example, a difference between a line width in the dense pattern region and that in the sparse pattern region and a difference between line widths within the surface of the wafer were both small as in the first example. An average of CD shifts was −50.3 nm and the difference between a line in the dense pattern region and that in the sparse pattern region was 2.6 nm.

As mentioned above, the average of the CD shifts was as large as −50.3 nm in the second example. For this reason, an actual line width becomes narrower than a designed line width. Thus, by designing a line width of the mask layer to be large in advance and reducing (trimming) it through the etching process, a wiring with a minute line width or the like, can be resultantly formed without having to set the line width of the mask layer to be excessively small in exposure and developing processes of the mask layer.

That is, by setting in advance the line width of the photoresist mask layer formed in the exposure and the developing process to be wider than the actual line width by 50 nm, a wiring with a desired fine line width can be obtained by the trimming carried out during the etching process of the second example.

Recently, a so-called ArF resist, which is a resist, the exposure process thereof being carried out by a laser beam using an ArF gas as a light source, is widely employed. The ArF resist is adequate for forming a minuter pattern than that formed by a conventional KrF resist. Since, however, the ArF resist has a low plasma-resistance, there exist certain disadvantages in that a surface of the resist may be roughened, selectivity against a to-be-etched portion (a ratio of etching rates) is small, and the resist may not be sustained. Further, main substances forming the ArF resist are, e.g., a cycloolefin resin, an acrylic resin containing alicyclic structure, a cyclooefin-maleic anhydride resin, and so on.

The present invention can be equally applied to such a case of using the ArF resist. A preferred embodiment using the ArF resist will now be described.

Figure 6A:
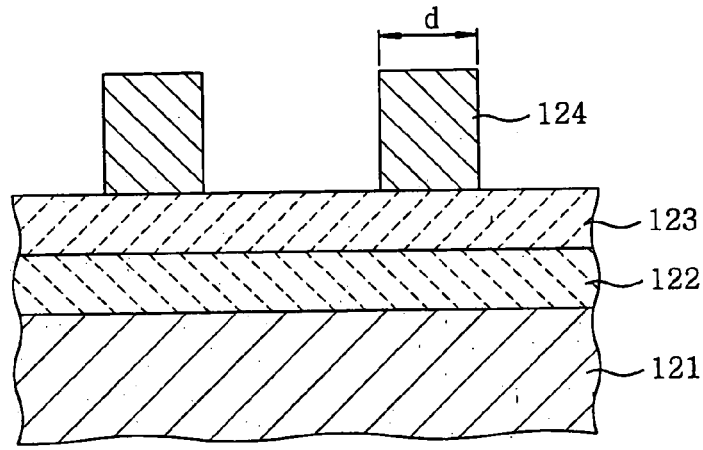
FIGS. 6A to 6C depict schematic cross sectional views of a wafer explaining another preferred embodiment of the present invention.
Figure 6B:
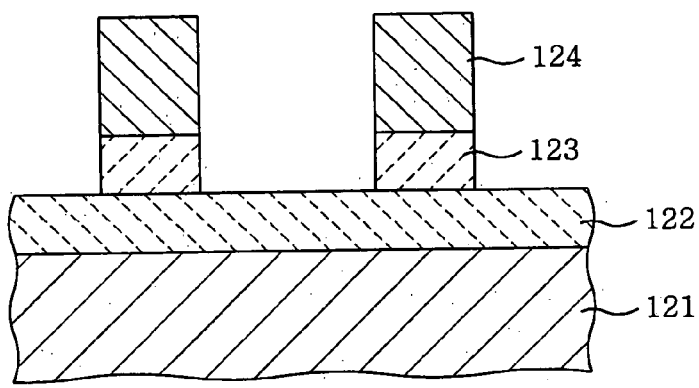
Figure 6C:
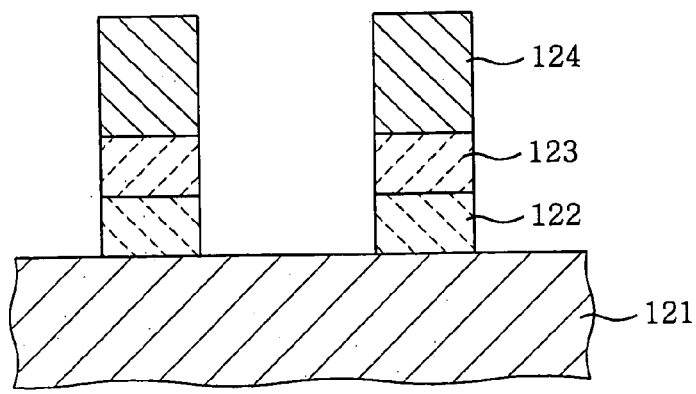

Referring to FIGS. 6A to 6C, there are illustrated partially enlarged schematic longitudinal cross sectional views of a semiconductor wafer (silicon substrate) for explaining the preferred embodiment using the ArF resist.

In the semiconductor wafer shown in FIGS. 6A to 6C, formed on a polysilicon film 121 is a silicon oxide film 122 having a predetermined thickness (in this embodiment, 50 nm) and, further, formed on the silicon oxide film 122 is an organic ARC film 123 having a certain predetermined thickness (80 nm in this embodiment), as illustrated in FIG. 6A. Further, formed on the organic ARC film 123 is an ArF resist 124 having a specific thickness (240 nm in this embodiment) and patterned in a predetermined pattern by an exposure process and a developing process as described above. Further, a line width of the ArF resist 124 (referred to as "d" in the drawing) is set to be 80 nm in this embodiment.

From a state shown in FIG. 6A, the organic ARC film 123 is etched first through the ArF resist 124 (mask layer) by plasma etching employing an etching gas containing a $CF_4$ gas and an $O_2$ gas, so that the organic ARC film 123 is patterned to have a predetermined pattern, as illustrated in FIG. 6B.

Thereafter, from a state shown in FIG. 6B, the silicon oxide film 122 is patterned into a preset pattern, as illustrated in FIG. 6C, by being plasma etched through the ArF resist 124 (mask layer) and the organic ARC film 123 by way of employing an etching gas containing a $CF_4$ gas and a $CHF_3$ gas.

Then, the ArF resist 124 and the organic ARC film 123 are removed by, e.g., ashing.

By etching the organic ARC film 123 and the silicon oxide film 122 through the above-described processes, the silicon oxide film 122 can be etched without causing a surface roughening and deterioration of the ArF resist 124.

Furthermore, in the etching process of the organic ARC film 123, a trimming described above can be carried out under a strict control over a trimming amount, and, further, an etching can be performed without changing a trimmed line width in the etching process of the silicon oxide film 122.

A wafer of a diameter of 200 mm was etched by following the above-described etching process as a third example. The etching was performed plural times while changing the value of a ratio [a flow rate of $O_2$/a flow rate of $(CF_4+O_2)$] in order to examine a variation in a trimming amount as a function of the ratio of the flow rate of $O_2$ to the total flow rate of an etching gas $(CF_4+O_2)$. The etching condition was as follows:

| (Etching of the organic ARC film) | |
|---|---|
| an etching gas: | $CF_4 + O_2$ (a total flow rate of 40 sccm) |
| a pressure: | 0.67 Pa (5 mTorr) |
| a high frequency power applied to the upper electrode: | 300 W |
| a high frequency power applied to the lower electrode: | 60 W |
| a distance between the electrodes: | 140 mm |
| a temperature (top/wall/bottom): | 80/60/75° C. |
| a He gas pressure (center/edge): | 400/400 Pa (3 Torr) |
| an overetching: | 10% |
| (Etching of the silicon oxide film) | |
| an etching gas: | $CF_4$ (a flow rate of 20 sccm) + $CHF_3$ (a flow rate of 20 sccm) |
| a pressure: | 5.3 Pa (40 mTorr) |
| a high frequency power applied to the upper electrode: | 600 W |
| a high frequency power applied to the lower electrode: | 100 W |
| a distance between the electrodes: | 140 mm |
| a temperature (top/wall/bottom): | 80/30/65° C. |
| a He gas pressure (center/edge): | 1300/1300 Pa (10 Torr) |
| an overetching: | 10%. |

A pattern obtained by the etching process of the third example was investigated by the SEM to find that the organic ARC film and the silicon oxide film could be etched without causing a surface roughening and deterioration of the ArF resist.

Figure 7:
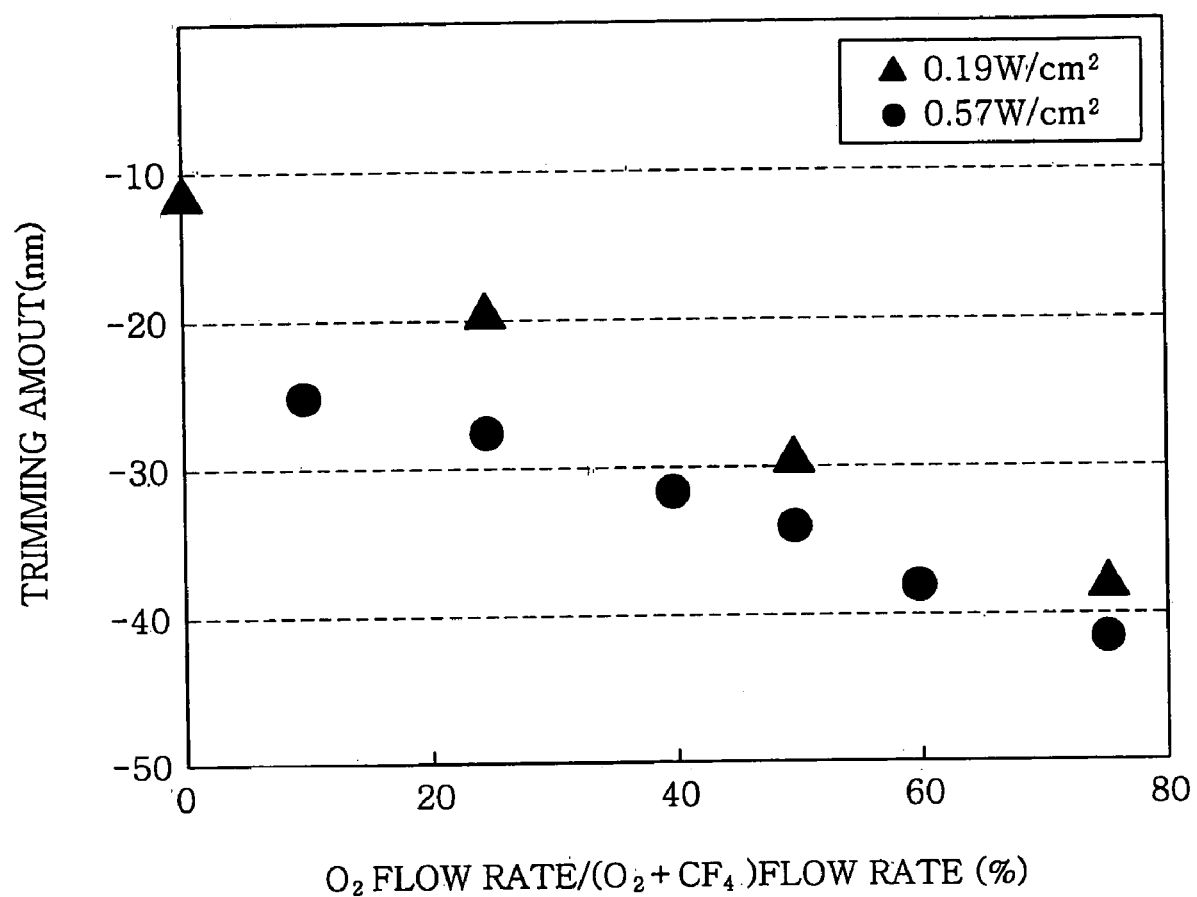
FIG. 7 describes a measurement result of a relationship between a gas flow ratio and a trimming amount.
Figure 8A:
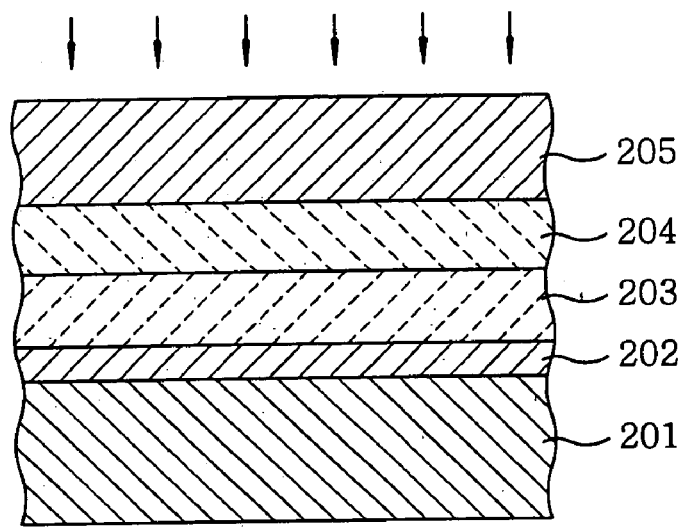
FIGS. 8A to 8C set forth schematic cross sectional views of a wafer explaining the prior art.
Figure 8B:
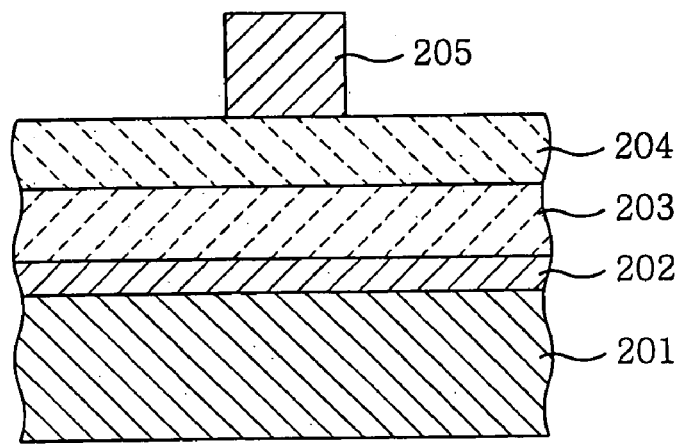
Figure 8C:
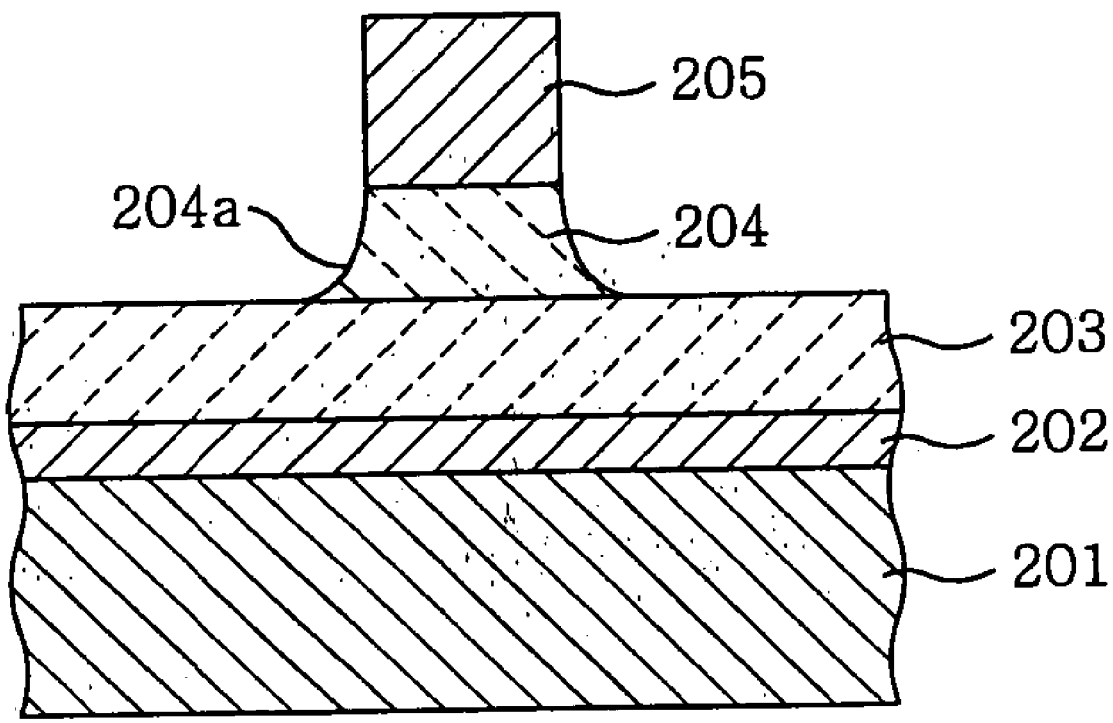

Furthermore, the trimming amount of the organic ARC film can be readily controlled by adjusting [the flow rate of $O_2$/the flow rate of $(CF_4+O_2)$] as shown in FIG. 7. FIG. 7 describes a relationship between the trimming amount and the ratio of [a flow rate of $O_2$/a flow rate of $(CF_4+O_2)$], wherein the result of the third example is represented by triangles and a vertical and a horizontal axes represent the trimming amount (nm) and the ratio (%) of [the flow rate of $O_2$/the flow rate of $(CF_4+O_2)$]. And, an amount of a high frequency power per unit area (a RF power density) applied to the lower electrode was 0.19 W/cm² in this case. As can be seen from FIG. 7, the trimming amount could be changed almost linearly by varying [the flow rate of $O_2$/the flow rate of $(CF_4+O_2)$].

In addition, the etching of the silicon oxide film could be carried out while substantially maintaining the line width (i.e., involving a small amount of trimming). An average of the trimming amounts (decrements in the line width) was −0.2 nm in the etching process of the silicon oxide film.

Next, an organic ARC film identical with that employed in the third example was etched by using a wafer having a diameter of 300 mm as a fourth example. The etching condition was as follows:

| (Etching of the organic ARC film) | |
|---|---|
| an etching gas: | $CF_4 + O_2$ (a total flow rate of 80 sccm) |
| a pressure: | 0.93 Pa (7 mTorr) |
| a high frequency power applied to the upper electrode: | 100 W |
| a high frequency power applied to the lower electrode: | 40 W |
| a distance between the electrodes: | 170 mm |
| a temperature (top/wall/bottom): | 80/60/75° C. |
| a He gas pressure (center/edge): | 670/670 Pa (5 Torr) |
| an overetching: | 10%. |

Circular dots in FIG. 7 describe a relationship between a trimming amount and a ratio (%) of [a flow rate of $O_2$/a flow rate of $(CF_4+O_2)$] in the fourth example. As shown in FIG. 7, the trimming amount could also be changed almost linearly by changing [the flow rate of $O_2$/the flow rate of $(CF_4+O_2)$] in the fourth example as well.

In the fourth example, an amount of a high frequency power per unit area (a RF power density) applied to the lower electrode was 0.57 W/cm², which is greater than 0.19 W/cm² in the third example. As a result, trimming amounts are found to be relatively increased compared to those in the third example, as shown in FIG. 7, which appears to be due to the fact that an etching in a transversal direction (trimming) progresses as the power density applied to the lower electrode increases because ionic energy is increased with the increase of the power density.

Therefore, by changing the amount of the high frequency power (power density) applied to the lower electrode while maintaining [the flow rate of $O_2$/the flow rate of $(CF_4+O_2)$] at a constant level, the trimming amount can be controlled.

Furthermore, though the preferred embodiments have been described for the case of employing the parallel plate type plasma etching apparatus for performing etching by applying high frequency powers to both the upper electrode and the lower electrode, the present invention is not limited thereto. That is, the present invention can be applied to any type of plasma etching apparatuses, for example, an etching apparatus for supplying a high frequency power to either one of the upper and the lower electrode, an etching apparatus for controlling the plasma by using a magnetic field, and so on.

INDUSTRIAL APPLICABILITY

The dry etching method in accordance with the present invention can be employed in the semiconductor industry manufacturing semiconductor devices. Thus, it has an industrial applicability.

What is claimed is:

1. A dry etching method for etching an organic antireflecting coating film through a mask layer formed to have a pattern, comprising:
    etching the organic anti-reflecting coating film by plasma etching employing an etching gas containing a $CF_4$ gas and an $O_2$ gas; and
    trimming a line width by etching the mask layer and the anti-reflecting coating film in a transversal direction.
2. The method of claim 1, wherein the pattern has a dense pattern region in which neighboring patterns are closer to each other and a sparse pattern region in which neighboring patterns are more spaced apart from each other, and the trimming is substantially uniformly carried out at the dense pattern region and the sparse pattern region.
3. The method of claim 1, wherein an amount of the trimming is controlled by varying a flow rate of $O_2$/(a flow rate of $CF_4$ +a flow rate of $O_2$) of the etching gas.
4. The method of claim 1, wherein an amount of the trimming is controlled by varying a power density of a high frequency power applied to a lower electrode.
5. The method of claim 1, wherein the mask layer is a resist film, and a silicon oxide film is formed under the organic anti-reflecting coating film.
6. The method of claim 5, wherein the resist film is an ArF resist film.
7. The method of claim 6, wherein the silicon oxide film is etched by using a gaseous mixture containing a $CF_4$ gas and a $CHF_3$ after etching the organic anti-reflecting coating film.
8. A dry etching method for etching an organic antireflecting coating film through a mask layer formed to have a pattern, comprising:
    etching the organic anti-reflecting coating film by plasma etching employing an etching gas containing an $N_2$ gas and an $O_2$ gas; and
    trimming a line width by etching the mask layer and the anti-reflecting coating film in a transversal direction.
9. The method of claim 8, wherein the pattern has a dense pattern region in which neighboring patterns are closer to each other and a sparse pattern region in which neighboring patterns are more spaced apart from each other, and the trimming is substantially uniformly carried out at the dense pattern region and the sparse pattern region.
10. The method of claim 8, wherein a flow rate of the $N_2$ gas is substantially identical to that of the $O_2$ gas.

* * * * *